US008219947B2

(12) United States Patent
Bist et al.

(10) Patent No.: US 8,219,947 B2
(45) Date of Patent: Jul. 10, 2012

(54) METHOD AND APPARATUS FOR MERGING EDA COVERAGE LOGS OF COVERAGE DATA

(75) Inventors: Manoj Bist, Sunnyvale, CA (US); Sandeep Mehrotra, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 868 days.

(21) Appl. No.: 12/210,876

(22) Filed: Sep. 15, 2008

(65) Prior Publication Data

US 2010/0070935 A1    Mar. 18, 2010

(51) Int. Cl.
*G06F 9/455* (2006.01)
*G06F 17/50* (2006.01)

(52) U.S. Cl. ........... 716/106; 716/100; 716/136; 703/14

(58) Field of Classification Search .................. 716/106, 716/136; 703/14
See application file for complete search history.

(56) References Cited

U.S. PATENT DOCUMENTS

| | | | |
|---|---|---|---|
| 6,141,630 A | 10/2000 | McNamara et al. | |
| 6,370,492 B1 | 4/2002 | Akin | |
| 6,718,498 B2 | 4/2004 | Imark et al. | |
| 6,718,521 B1 * | 4/2004 | Bentlage et al. | 716/136 |
| 6,742,166 B2 | 5/2004 | Foster et al. | |
| 2004/0225973 A1 * | 11/2004 | Johnson | 716/4 |
| 2008/0127026 A1 | 5/2008 | Murase | |

OTHER PUBLICATIONS

International Search Report mailed Mar. 16, 2010 for PCT Family Member Application No. PCT/US09/052352, 10 pages.

* cited by examiner

*Primary Examiner* — Paul Dinh
*Assistant Examiner* — Patrick Sandoval
(74) *Attorney, Agent, or Firm* — Haynes Beffel & Wolfeld LLP; Kenta Suzue

(57) ABSTRACT

An electronic design automation technology merges coverage logs. The coverage logs are generated by verification of a hardware description language circuit design. The coverage logs are merged as the coverage logs are generated, without waiting for all pending coverage logs. Another electronic design automation technology also merges coverage logs. The merged coverage logs include a first coverage log of a first simulation of a hardware description language circuit design and a second coverage log of a second simulation of the hardware description language circuit design. The first simulation is based on a first hardware verification language coverage model of the hardware description language circuit design. The second simulation is based on a second hardware verification language coverage model of the hardware description language circuit design. The second hardware verification language coverage model is newer and different than the first hardware verification language coverage model.

18 Claims, 6 Drawing Sheets

400

METHOD AND APPARATUS FOR MERGING EDA COVERAGE LOGS OF COVERAGE DATA

BACKGROUND

Electronic design automation EDA is applied in the semiconductor industry for virtually all device design projects. After an idea for the product is developed, EDA tools are utilized to define a specific implementation. The implementation defined using EDA tools is used to create mask data used for production of masks for lithographic use in the production of the finished chips, in a process referred to as tape-out. The masks are then created and used with fabrication equipment to manufacture integrated circuit wafers. The wafers are diced, packaged and assembled to provide integrated circuit chips for distribution.

An exemplary procedure for design using EDA tools begins with an overall system design using architecture defining tools that describe the functionality of the product to be implemented using the integrated circuit. Next, logic design tools are applied to create a high level description based on description languages such as Verilog or VHDL, and functional verification tools are applied in an iterative process to assure that the high-level description accomplishes the design goals. Next, synthesis and design-for-test tools are used to translate the high-level description to a netlist, optimize the netlist for target technology, and design and implement tests that permit checking of the finished chip against the netlist.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking DRC, layout rule checking LRC and layout versus schematic LVS checking, that analyze manufacturability, electrical performance, lithographic parameters and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

SUMMARY

One aspect of the technology is an electronic design automation method that merges coverage logs. The coverage logs are generated by verification of a hardware description language circuit design. The coverage logs are merged as the coverage logs are generated, without waiting for all coverage logs of pending verification. Examples of pending verification are pending dynamic simulation (e.g., pure random simulation, directed random simulation, and pure directed simulation) and pending formal verification.

In some embodiments, at least one of the coverage logs is generated by simulation of the hardware description language circuit design. In some embodiments, merging coverage logs results in a merged coverage log including formal verification coverage data.

Various embodiments have results that are responsive to the merging of coverage logs. One such result is altering a condition of a pending simulation of the hardware description language circuit design. Examples f changing a condition include altering an input parameter, such as altering an input condition (e.g., changing the input configuration file and/or parameters to simulate the chip in a different mode/configuration, changing the control parameters of the testbench that would in turn add more constraints and/or relax existing constraints thereby causing different input stimulus to be generated) or changing a random seed condition.

Another such result is freeing at least part of mass storage.

Another such result—responsive to not just the merging of coverage logs but also to a predetermined condition being met—is generating a coverage report.

Another such result is determining that, completing a pending verification is expected to insufficiently improve verification coverage of the hardware description language circuit design. One way to determine that the pending verification is expected to insufficiently improve verification coverage, is determining that an attribute of the hardware description language circuit design to be simulated by a pending simulation has been simulated already. In one embodiment, when it is determined that the pending verification is expected to insufficiently improve verification coverage, then the pending verification is stopped.

Another such result updating a coverage metric of verification coverage of the hardware description language circuit design. The coverage metric is inclusive of coverage data from merging the coverage logs. Example coverage metrics consider assertion coverage, functional coverage, and code coverage (e.g., line coverage, condition coverage, branch coverage, path coverage, toggle coverage, assign toggle coverage).

In some embodiments, the technology changes from a status of unreadiness, to readiness to merge coverage logs. In response to this status change, coverage log data are requested that was generated prior to the status change.

Some embodiments create multiple running instances. These multiple running instances perform merging of coverage logs of simulations of the hardware description language circuit design, or verification generally.

Another aspect of the technology is an electronic design automation method that merges coverage logs. The merged coverage logs include a first coverage log of a first simulation of a hardware description language circuit design and a second coverage log of a second simulation of the hardware description language circuit design. The first simulation is based on a first hardware verification language coverage model of the hardware description language circuit design. The second simulation is based on a second hardware verification language coverage model of the hardware description language circuit design. The second hardware verification language coverage model is newer and different than the first hardware verification language coverage model.

The hardware description language of the hardware description language circuit design includes any of Verilog, SystemVerilog, and VHDL.

The hardware verification language of the first and second hardware verification language models includes any of SystemVerilog, Native Testbench, E, and Vera.

Various embodiments have various conditions that control whether coverage data is deleted and/or retained, responsive to merging the coverage logs.

One such condition includes, responsive to the first coverage log and the second coverage log including different maximum numbers of automatically created bins, retaining coverage data of the cover point of the second coverage log and deleting coverage data of the cover point from the first coverage log.

Another such condition includes, responsive to the first coverage log including a bin having a bin name absent from the second coverage log, deleting coverage data of the bin after said merging.

Another such condition includes, responsive to the first coverage log including a bin having a bin name present in the second coverage log, retaining coverage data of the bin after said merging.

Another such condition includes, responsive to the first coverage log having a cover point with a first expression width and the second coverage log having the cover point with a second expression width different from the first expression width, retaining coverage data of the cover point with the second expression width and deleting coverage data of the cover point with first expression width.

Another such condition includes, responsive to the first coverage log having a bin with a first bin definition and the second coverage log has the bin with a second bin definition different from the first bin definition, then after said merging, retaining coverage data of the bin with the second bin definition and deleting coverage data of the first bin definition.

Another such condition includes, responsive to the first coverage log including a cross coverage point name of a cross coverage point naming at least two coverage point identifiers, and the second coverage log includes the cross coverage point name of the cross coverage point naming said at least two coverage point identifiers, then deleting coverage data of the cross coverage point of the first coverage log responsive to deletion of coverage data of at least one of the identified coverage points from the first coverage log.

Another such condition includes, responsive to the first coverage log including a first user-defined cross bin of a first cross coverage point, and the second coverage log including a second user-defined cross bin of a second cross coverage point, the first cross coverage point and the second cross coverage point having a same name, then despite the first user-defined cross bin and the second user-defined cross bin having different definitions, retaining coverage data of the first user-defined cross bin and coverage data of the second user-defined cross bin.

Another such condition includes, responsive to the first coverage log including first autocross bins of a first cross coverage point, and the second coverage log including a second user-defined cross bin subsuming the autocross bins of the first cross coverage point, retaining coverage data of the first autocross bins in the second user-defined cross bin of the second coverage log.

Another such condition includes, responsive to the first coverage log including a first cross coverage point, and the second coverage log including a second cross coverage point, then despite the first cross coverage point and the second cross coverage point having different auto cross coverage space, retaining i) auto cross coverage data of the first cross coverage point that is subsumed by auto cross coverage space of the second cross coverage point, and ii) coverage data of the second cross coverage point.

Another such condition includes, responsive to the second coverage log including a cross coverage point absent from the first coverage log, retaining the cross coverage point.

Another such condition includes, responsive to the first coverage log including a cross coverage point absent from the second coverage log, deleting the cross coverage point.

Another such condition includes, responsive to the first coverage log including property coverage absent from the second coverage log, retaining the property coverage.

Another such condition includes, responsive to the second coverage log including property coverage absent from the first coverage log, retaining the property coverage.

Other aspects of the technology are directed to a computer readable medium with computer readable instructions for circuit design, including computer instructions performing the technology described herein. Other aspects of the technology are directed to a computer with a memory storing computer instructions performing the technology described herein.

DETAILED DESCRIPTION

Figure 1:
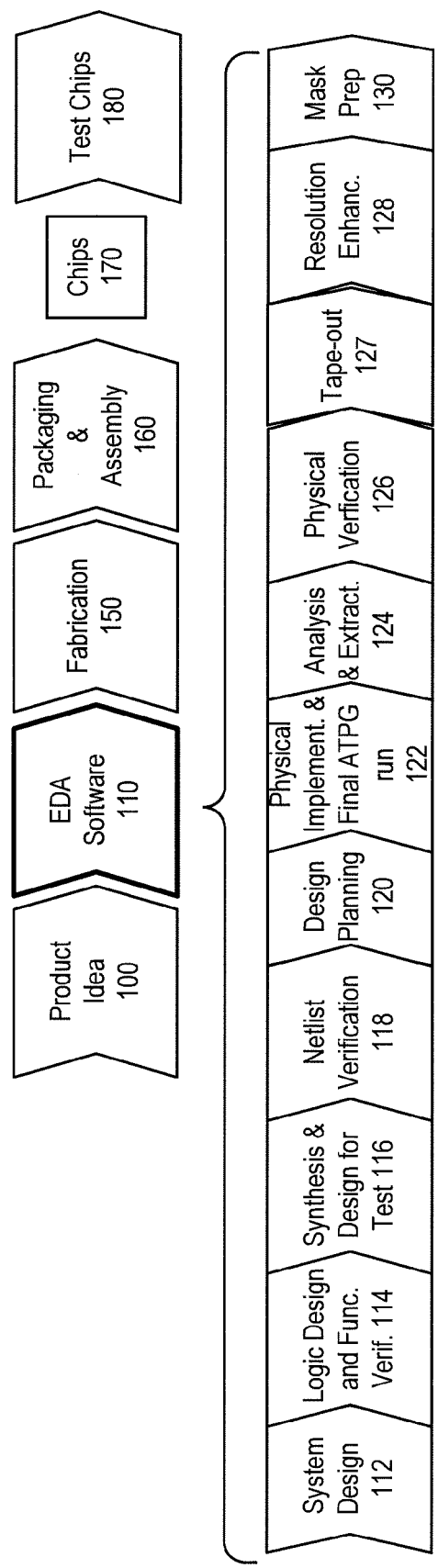
FIG. 1 is a simplified process flow of making integrated circuits, from the idea stage, through electronic design automation (EDA) stages, and ending with the integrated circuits.

FIG. 1 is a simplified process flow of making integrated circuits, from the idea stage, through electronic design automation (EDA) stages, and ending with the integrated circuits.

FIG. 1 shows a simplified representation of an illustrative digital integrated circuit design and test flow. As with all flowcharts herein, it will be appreciated that many of the steps in FIG. 1 can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied. Such re-arrangement possibilities will be apparent to the reader.

At a high level, the process of FIG. 1 starts with the product idea (step 100) and is realized in an EDA (Electronic Design Automation) software design process (step 110). When the design is finalized, the fabrication process (step 150) and packaging and assembly processes (step 160) occur resulting, ultimately, in finished integrated circuit chips (result 170). Some or all of the finished chips are tested in step 180 on a tester machine using predefined test vectors and expected responses.

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products. While some designs might at this stage already include certain design-for-test features such as scan chains and associated scan compression or decompression circuitry, these are not included in the terms "logic design" and "circuit design" as they are used herein.

Synthesis and design for test (DFT) (step 116): Here, the VHDL/Verilog is translated to a netlist. The netlist can be optimized for the target technology. Additionally, the implementation of a test architecture occurs in this step, to permit checking of the finished chips. Example EDA software products from Synopsys, Inc. that can be used at this step include Design Compiler®, Physical Compiler, Test Compiler, Power Compiler, FPGA Compiler, TetraMAX, and DesignWare® products. A current product for implementing a test architecture, with a few user-specified configuration settings as described above, is DFT MAX. DFT MAX is described in Synopsys, DFT MAX Adaptive Scan Compression Synthesis, Datasheet (2007), incorporated herein by reference.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape-out" data for production of masks for lithographic use to produce finished chips. Example EDA software products from Synopsys, Inc. that can be used at this step include the CATS(R) family of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask preparation (step 130): This step includes both mask data preparation and the writing of the masks themselves.

Aspects of the present technology relate particularly to "logic design and functional verification" described above.

Design and functional verification is the process of proving that the hardware description language circuit design satisfies the design specification of the circuit. Although both static and dynamic methods of verification are available, static methods tend to be limited to relatively small circuit blocks due to the limitations of performing formal proofs of the hardware description language circuit design. Dynamic methods rely on simulation of the hardware description language circuit design, and cannot achieve complete verification. To accomplish a reasonably thorough verification of the hardware description language circuit design with a modern complexity of millions of gates, simulation farms run numerous simulations with different conditions, such as different input conditions or different random seeds. Such simulation continues until the aggregate coverage metric(s) is/are satisfactory.

Due to the trend of decreasing cost for increased computation resources, each time the simulation model is adjusted, one of ordinary skill in the art would tend to re-run simulations to reach a satisfactory coverage metric(s) result.

The resulting coverage data from completed simulations of the hardware description language circuit design are stored in mass storage as coverage logs. The various Electronic Design Automation vendors generally have their own proprietary coverage logs that store only Electronic Design Automation coverage data and do not store general purpose data as with databases by Oracle, IBM, MySQL, etc. Coverage data is a set of interesting conditions, or attributes, that are expected to happen during simulation.

In some embodiments, the coverage logs are merged. The coverage model is a set of interesting conditions that we want to observe during simulation. Each simulation creates a coverage log that represents which portion of the coverage model was covered by that simulation. The merging operation aggregates the coverage logs to compute which parts of the coverage model are collectively covered by all the simulations.

The simulations are performed according to the hardware verification language coverage model, which includes functional coverage and assertion coverage. Other embodiments include various combinations of one or more of functional coverage, assertion coverage, and code coverage.

Coverage data are discussed in "IEEE Standard for SystemVerilog—Unified Hardware Design, Specification, and Verification Language", IEEE Std 1800, hereby incorporated by reference. The following discussion of coverage data is largely taken from this IEEE standard.

A coverage group, or covergroup, can contain one or more coverage points, or coverpoints. A coverage point can be an integral variable or an integral expression. Each coverage point includes a set of bins associated with its sampled values or its value transitions. The bins can be explicitly defined by the user or automatically created by the hardware verification language environment. Bins for a coverage point can be automatically created by the hardware verification language environment or explicitly defined.

A coverage point bin, or bin, associates a name and a count with a set of values or a sequence of value transitions. If the bin designates a set of values, the count is incremented every time the coverage point matches one of the values in the set. If the bin designates a sequence of value transitions, the count is incremented every time the coverage point matches the entire sequence of value transitions.

Thus, a bin is a unit identifying an attribute of the hardware description language circuit undergoing simulation, such that after simulation the coverage metric of the model is calculated based on the bins. The coverage metric is an assessment of progress of verifying a hardware description language circuit design. The coverage model is the aggregate of all bins, including cross points of bins and cover points of bins. In some embodiments, the same model is used for all simulations, and the resulting coverage data are merged. In other embodiments, different models are used for at least some simulations, and the resulting coverage data are selectively merged.

A cover group can specify cross coverage between two or more coverage points or variables. Cross coverage of a set of N coverage points is defined as the coverage of all combinations of all bins associated with the N coverage points, that is, the Cartesian product of the N sets of coverage point bins. An autocross coverage is an automatically generated cross coverage of a coverage point with another coverage point.

Coverage of a coverage point item can be computed differently depending on whether the bins of the coverage point are explicitly defined by the user or automatically created by the tool.

For user-defined bins, the coverage of a coverage point is computed as the ratio of: i) the cardinality of the covered bins, i.e. the subset of all (defined) bins that are covered, and ii) the cardinality of the set of bins defined.

For automatically generated bins, the coverage of a coverage point is computed as the ratio of: i) the cardinality of the covered bin, i.e. the subset of all (auto-defined) bins that are covered, and ii) the lesser of a) the minimum number of bits needed to represent the coverage point and b) auto_bin_max.

Cumulative coverage considers the union of all significant bins; thus, it includes the contribution of all bins (including overlapping bins) of all instances.

To determine whether a particular bin of a coverage group is covered, the cumulative coverage computation considers the value of the at least option of all instances being accumulated. Consequently, a bin is not considered covered unless its hit count equals or exceeds the maximum of all the at_least values of all instances. Use of the maximum represents the more conservative choice.

Figure 2:
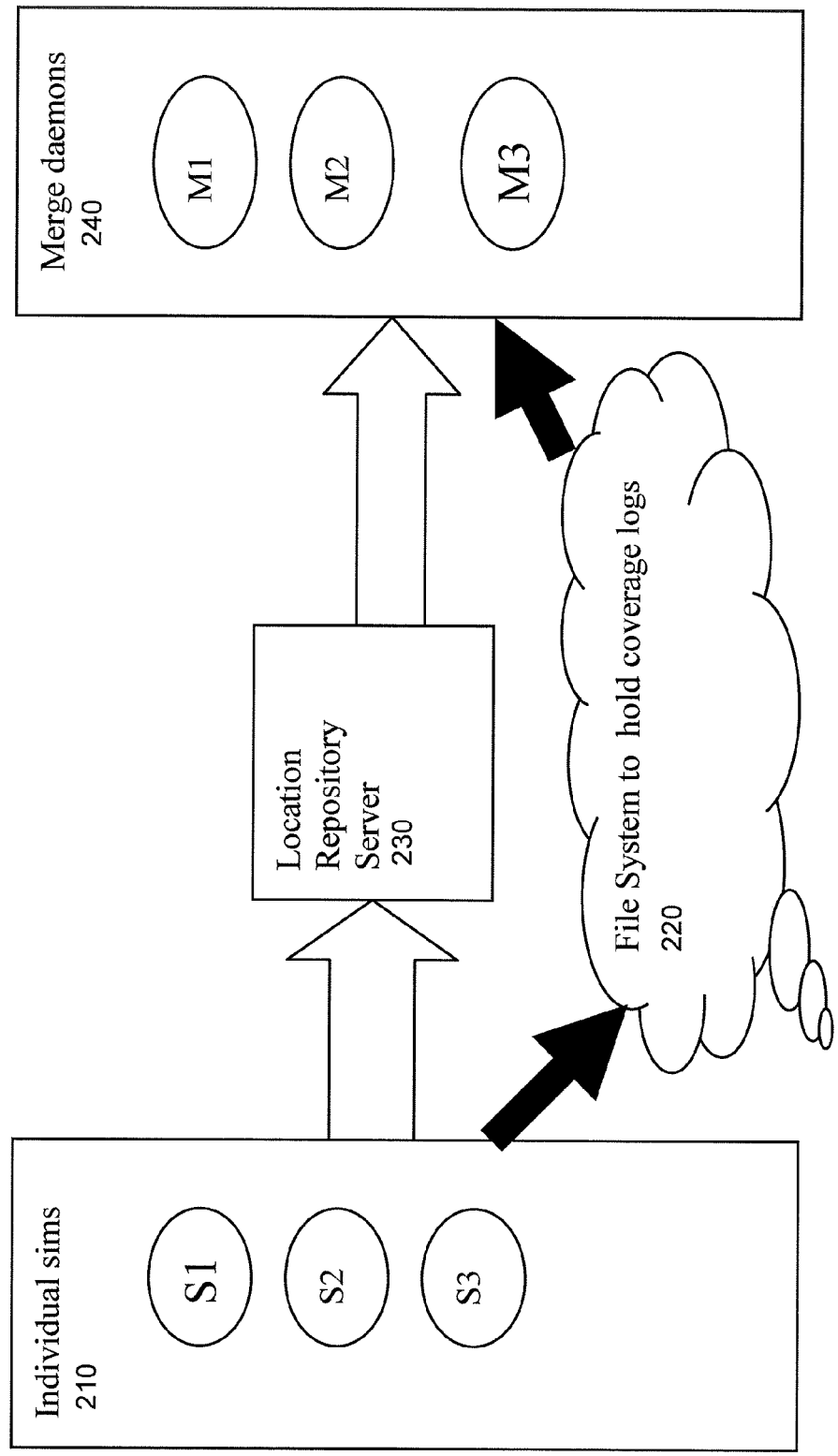
FIG. 2 is a simplified block diagram of a system performing simulation of a hardware verification language circuit design.
Figure 3:
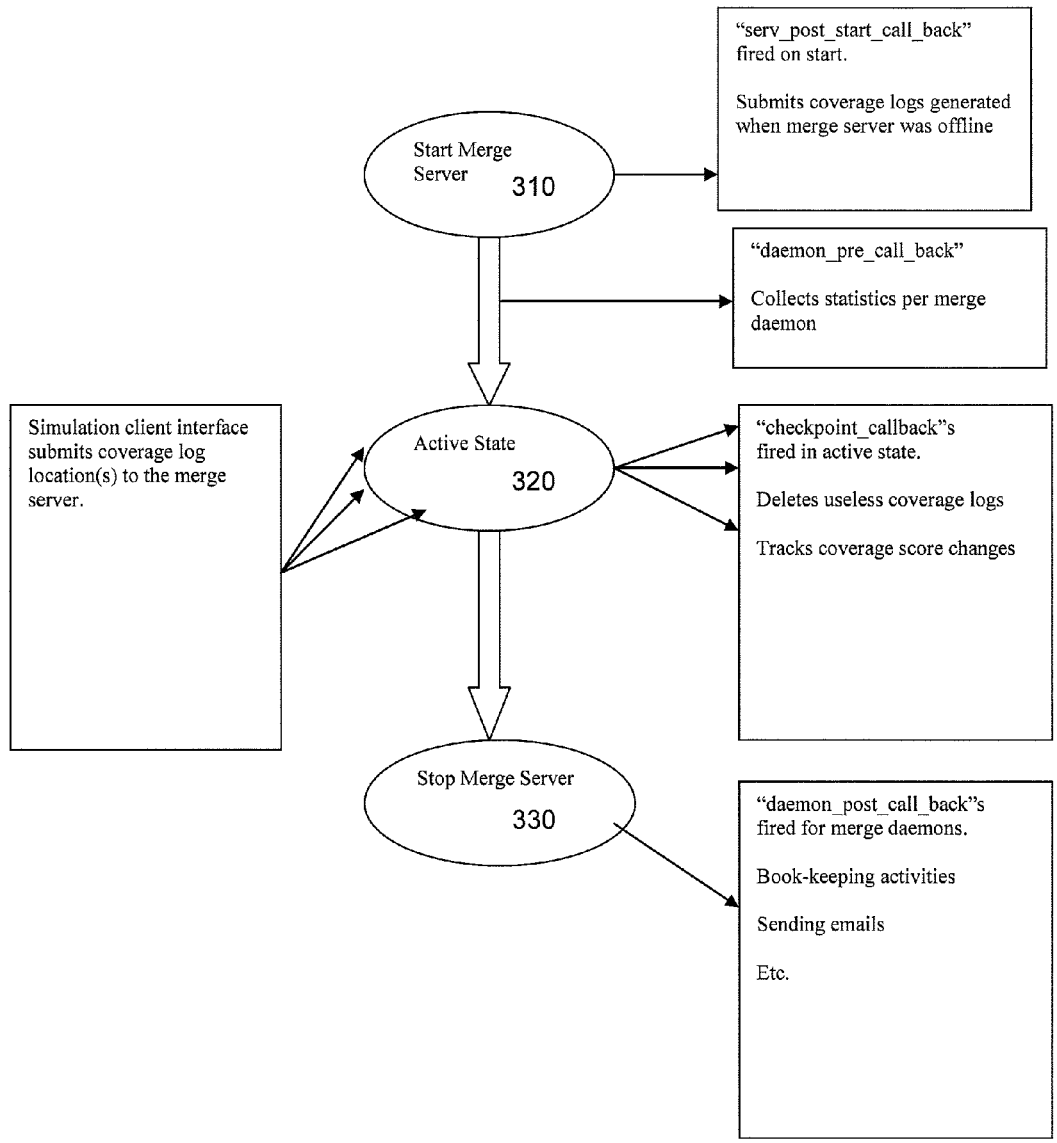
FIG. 3 is a simplified state diagram showing the operation of the simulation system of FIG. 2.
Figure 4:
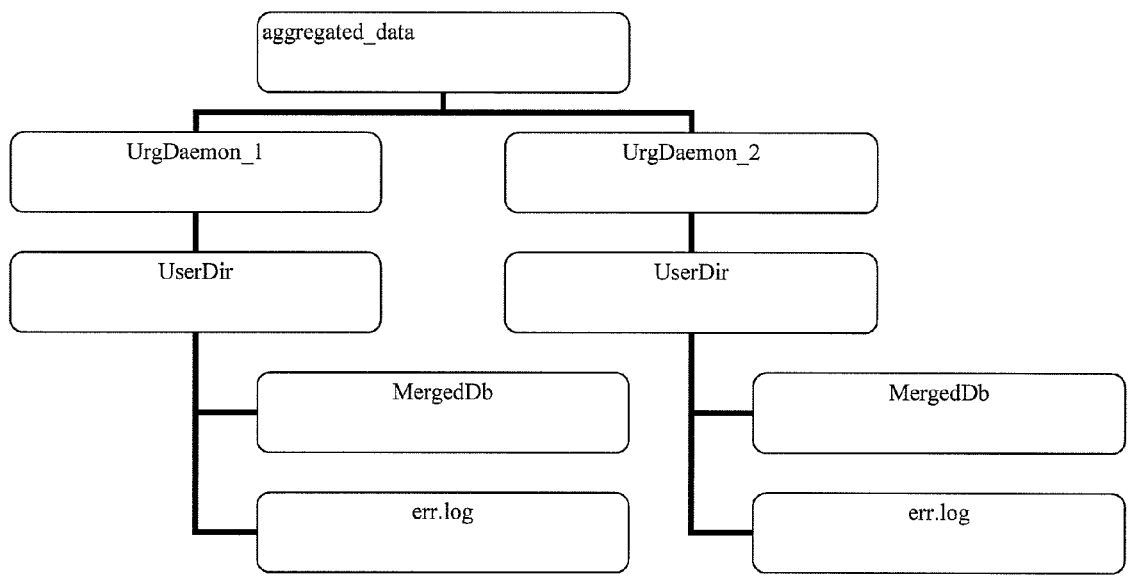
FIG. 4 is a simplified directory structure of the simulation system of FIGS. 2 and 3.

FIGS. 2-4 address an embodiment of EDA verification, in particular coverage driven verification.

This discussed embodiment does not require that all coverage logs be created before they can be merged. This approach scales particularly well in a random regression test environment where random tests are run 24 hours a day, 7 days a week, with numerous input conditions or random seeds. Because coverage logs are merged prior to the creation of the last coverage log, in this approach the amount of disk space required is no longer directly proportional to the number of tests. Similarly, one does not need to wait until the last simulation has finished running, to sample a merged coverage log. A pipeline is maintained of the unprocessed (unmerged) coverage logs. Early aggregation of coverage logs also allows assists the identification and analysis of coverage holes well before all the tests have finished running. "Bad" stimulus is uncovered sooner rather than later.

FIGS. 2-4 are discussed below.

FIG. 2 is a simplified block diagram of a system performing simulation of a hardware verification language circuit design. The system includes individual simulation clients 210, a file system 220 to store coverage logs, a location repository server 230, and merge daemons 240. The simulation clients acting as multiple producers, and "urg" merge daemons act as multiple consumers and provide the synchronization primitives to maintain consistency of the queue.

Individual simulation clients 210 are the individual random simulations that generate functional coverage logs. Each test client dumps out a coverage log representing parts of the coverage model it targeted. Each client ensures the following:

1) It does not overstep on a different simulation client's database directory.

2) It saves the log on a file system accessible from the machine where the "Urg merge daemons" are running for unified report generators.

3) These clients talk to the location repository server using an interface, for example in Perl.

The clients inform the location repository server 230 of the directory where the coverage logs are located on the file system 220. An example implementation is an object oriented perl interface e.g. VtgSimClientIntf, with the following examplary methods:

1) new: Constructor to create the object. Takes two mandatory arguments and one optional argument.
  i) server: name of the machine where the location repository server is running
  ii) port: port number on which the location repository server is running
  iii) newmodel: This argument is optional. The default value is 0. When set to 1, it switches the master model used for flexible merging at the merge server.

2) dispatchLocation: Method to inform the location repository server regarding the location of the coverage log. Returns a small xml string on success and undef on failure.

Example 1:

```
use VtgSimClientIntf;
my $simcli = VtgSimClientIntf->new(server=>'vgamd84', port=>7070);
   my $retVal = $simcli ->dispatchDbLocation("/u/foo/bar.vdb");
If successful the value of $retVal would be:
<dbsummary currdb="/u/foo/bar.vdb" />
```

Example 2:

```
use VtgSimClientIntf;
   my $simcli = VtgSimClientIntf->new(server=>'vgamd84',
port=>7070, newmodel=>1);
      my $retVal = $simcli ->dispatchDbLocation("/u/foo/bar.vdb");
```

This example switches the master coverage model used by mergeserver to the one stored under/u/foo/bar.vdb. If successful the value of $retVal would be:

<dbsummary currdb="/u/foo/bar.vdb"/>

The file system 220 to hold coverage logs collectively represents enormous amounts of mass storage, due to the demands of storing the coverage logs from the large number of individual simulation clients 210.

Location repository server 230 is a lightweight server which keeps track of the location of individual coverage log directories generated by individual simulations. It keeps track of the top directory location. Some embodiments do not do data movement.

Merge daemons 240 are computation intensive processes that query the location repository server 230 to fetch the list of coverage logs to process. The actual coverage logs are then accessed from the file system 220 and processed. An aggregation tool such as urg (unified report generator) merges coverage logs generated by individual simulations to compute which parts of the coverage model are collectively covered by all tests in the verification suite. The merge daemons provide hooks to sample the accumulated coverage logs before completion of all coverage logs.

FIG. 3 is a simplified state diagram showing the operation of the simulation system of FIG. 2.

The early state is start merge server 310. The merge server starts and is capable of receiving coverage logs, and then fires the 'serv_post_start_call_back'. This callback is used for submitting any coverage log that has been generated while the merge server was offline. If multiple merge servers run on the same machine, option "daemon_port_start" specifies the port of the merge server behind which the merge daemons run.

The intermediate state is active state 310. As simulations run, when a particular simulation job finishes, it uses the simulation client interface to submit the coverage log location to the merge server. At this state, checkpoint callbacks occur. After merging a predetermined number of coverage logs (configurable by checkpoint_granularity in the config file) or at regular intervals (configurable by time_granularity), it fires the 'checkpoint callback' for each merge daemon. This callback deletes coverage logs which do not add any value or keep track of how the coverage metrics are changing.

The later state is stop the merge server 330. At this point it fires daemon_post_call_back for each merge daemon. This performs clean up activities, sends email etc.

Details regarding merge server hooks/callbacks follow below, listed from A)-E):

A) Coverage log submission hook: This hook allows coverage logs to submitted to the merge server for aggregation.

B) Location server post start callback: ('serv_post_start_call_back' in the diagram) This callback gets fired once the merge server starts and is capable of receiving coverage logs. This callback should be used for submitting any coverage logs (using the coverage log submission hook) that have been generated while the merge server was offline.

C) Checkpoint callback: (checkpoint_callback in the diagram) This callback gets fired at regular intervals, configured via the following parameters:

1) time_granularity: The user can set this parameter to a value (in seconds) to indicate when this callback should be fired. E.g if the value is 1800 sec, the callback will be fired after every 1800 sec.

2) checkpoint_granularity: The user can set this parameter to indicate how often this callback should be fired. For e.g. if the value is set to 900, then this callback will be fired after merging every 900 coverage logs.

In addition to the predetermined conditions above, other predetermined conditions that fire this callback and generate a coverage report are a coverage percentage or other coverage metric amount reached by the merged coverage log.

If both the parameters are set, then the callback will be fired whichever event happens first. The checkpoint_callback has the following info:

1) Base score for each metric in the last callback
2) For each coverage log merged, the checkpoint callback has the following info: 2a) name of the coverage log 2b) aggregated coverage score for each metric This callback can be used to implement custom actions. Some of them are mentioned below:

1) Incremental grading: If the incremental coverage score for a coverage log is zero, then it can be deleted. Incremental coverage added by a test is built into the hooks exposed by the merge server. So, if a coverage log does not add any value it can be deleted promptly, thereby bounding the required amount of mass storage by about the total number of coverable objects being targeted.

2) Monitor how coverage score is changing with time: This callback can be used to plot how the coverage score is changing with time. If the coverage score does not change or changes very little, the client can attempt to change the stimulus or indicate to a real person (via email/page) that an action needs to be taken.

3) Backing up of good tests: The client can determine if a specific coverage log indicates a change in coverage score or covers a difficult to hit/cover coverable object and back up that test.

Generally, checkpoint callback command is capable of running asynchronously with the merge daemon. The merge daemon will not wait for the script to finish. The checkpoint callback interface is a command capable of processing an xml file. If the command is 'cpcb', it would be invoked as 'cpcb path-to-a-valid-xml-file' from the merge daemon after it creates a checkpoint.

An example schema of the checkpoint callback interface file follows:

```
<!ELEMENT checkpointed_databases (basescore) (dir*)>
<!ELEMENT basescore (score*) >
<!ATTLIST  basescore EMPTY>
<!ELEMENT dir (test*) >
<!ATTLIST  dir path CDATA #REQUIRED>
<!ATTLIST  dir error (yes|no) #REQUIRED>
<!ATTLIST  dir newmodel (yes|no) #OPTIONAL>
<!ELEMENT test (score*) >
<!ATTLIST  test name CDATA #REQUIRED>
<!ELEMENT score >
<!ATTLIST  score metric  (assert|testbench|line|cond|fsm|branch) # REQUIRED >
<!ATTLIST score  numerator  CDATA #REQUIRED>
<!ATTLIST score  denominator  CDATA #REQUIRED>
```

The "basescore" element contains the coverage data score for the test onto which all the coverage log directories were incrementally merged.

The "dir" element represents the top level coverage log directory that was processed. The attribute "path" indicates the location of the directory. The attribute "error" indicates if an error occurred while processing that directory. The error details are redirected to file "err.log".

"score" represents the coverage score for each test on a metric by metric basis.

An example checkpoint callback file follows:

```xml
<checkpointed_databases>
    <basescore >
        <score metric="assert" numerator="0" denominator="0" />
        <score metric="testbench" numerator="0" denominator="0" />
    </basescore>
    <dir path="/remote/vtghome6/manojb/demo/pr/junk/db_0" , error="no">
        <test name="/remote/vtghome6/manojb/demo/pr/junk/db_0/results" >
        <score metric="assert" numerator="1" denominator="1" />
        <score metric="testbench" numerator="0" denominator="0" />
        </test>
        <test name="/remote/vtghome6/manojb/demo/pr/junk/db_0/t3" >
        <score metric="assert" numerator="1" denominator="1" />
        <score metric="testbench" numerator="0" denominator="0" />
        </test>
        <test name="/remote/vtghome6/manojb/demo/pr/junk/db_0/test" >
        <score metric="assert" numerator="1" denominator="1" />
        <score metric="testbench" numerator="47" denominator="50997" />
        </test>
    </dir>
    <dir path="/remote/vtghome6/manojb/demo/pr/junk/db_1" , error="no" newmodel="yes">
        <test name="/remote/vtghome6/manojb/demo/pr/junk/db_1/results" >
        <score metric="assert" numerator="1" denominator="1" />
        <score metric="testbench" numerator="47" denominator="50997" />
        </test>
        <test name="/remote/vtghome6/manojb/demo/pr/junk/db_1/t3" >
        <score metric="assert" numerator="1" denominator="1" />
        <score metric="testbench" numerator="47" denominator="50997" />
        </test>
        <test name="/remote/vtghome6/manojb/demo/pr/junk/db_1/test" >
        <score metric="assert" numerator="1" denominator="1" />
        <score metric="testbench" numerator="47" denominator="50997"/>
        </test>
    </dir>
</ checkpointed_databases>
```

D) Daemon pre start call back: (daemon_pre_call_back in the diagram). This callback is fired once before the merge daemon start processing coverage logs. This callback can be used to collect statistics for each merge daemon.

E) Daemon post start call back: (daemon_post_call_back in the diagram) This callback gets fired when the merge server is stopped. One such callback is fired for each merge daemon. This can be used to take actions like the following:

1. Generate custom reports
2. Send emails etc.

FIG. 4 is a simplified directory structure of the simulation system of FIGS. 2 and 3.

By default each merge daemon creates a sub directory inside the directory specified by directory_prefix. For example, for the default configuration file specified by "./aggregated_data", the directory structure of FIG. 4 is created. "UrgDaemon_1/UserDir/MergeDb" is the aggregated coverage log created by the first merge daemon. "UrgDaemon_1/UserDir/err.log" is the error log file for the coverage log aggregation done by the first daemon. Errors (corrupt coverage logs, bugs/crashes in the tool) are redirected to this file.

The following is an example syntax of launching a merge server on location repository server 230.

mergeserv [--config=<config_file>]--start|--stop config_file is the [optional] configuration file read by the merge server. An example format of this configuration file is provided below.

--start: Starts the merge server. If the merge server is already running, this option does not do anything.

--stop: Stops the merge server. This initiates the stop sequence. The merge server exits after all the submitted databases have been merged.

An example merge server configuration file follows, in xml format.

```xml
<mserv_config>
    <location_serv port="7070" datadir="/u/regress_usr/locationdb" />
    <serv_post_start_call_back command="submit_again" />
    <merge_daemon num="2" directory_prefix="./aggregated_data">
        <daemon_pre_call_back command="pre.pl"/>
        <merge_daemon_options checkpoint_granularity="300" time_granularity="900" />
        <check_point_call_back command="foo.pl" />
        <daemon_post_call_back command="post.pl"/>
    </merge_daemon>
</mserv_config>
```

In this example default configuration:

1) Location repository server runs on port 7070.
2) A single instance of merge daemon is fired.
3) All merge daemon clients create the aggregated data under directory "aggregated_data".
4) Merge server maintains the list of unprocessed coverage logs in a log that is stored under the directory specified by the attribute datadir. In many embodiments, only the user running the merge server has write permissions to this directory. The default value of datadir is ".".

Running multiple instances of the merge daemon is a performance optimization to handle the case in which coverage logs are generated quickly. To run multiple merge servers on the same machine, the config file used for firing the individual merge servers should not conflict with each other. Specifically the following entries in the config file should not conflict.

i) location serv port
ii) datadir
iii) directory_prefix
iv) daemon_port_start

Also, any callback script used with the merge servers should not modify the same system resources. For example, if the checkpoint callback saves useful test information in some file/directory, then the file/directory used by the individual callback scripts should be different for each merge server.

Here is an example of sample config files for running two merge servers on the same machine.

```
<mserv_config>
    <location_serv port="7070" datadir="/u/regress_usr/locationdb" />
    <serv_post_start_call_back command="submit_again" />
    <merge_daemon num="2" directory_prefix="./aggregated_data">
        <daemon_pre_call_back command="pre.pl"/>
        <merge_daemon_options checkpoint_granularity="300" time_granularity="900" />
        <check_point_call_back command="foo.pl" />
        <daemon_post_call_back command="post.pl"/>
    </merge_daemon>
</mserv_config>
<mserv_config>
    <location_serv port="7071" datadir="/u/regress_usr/locationdb.second"/>
    <serv_post_start_call_back command="submit_again" />
    <merge_daemon num="2" directory_prefix="./aggregated_data.second">
        <daemon_pre_call_back command="pre.pl"/>
        <merge_daemon_options checkpoint_granularity="300" time_granularity="900" daemon_port_start="14449" />
        <check_point_call_back command="foo.pl" />
        <daemon_post_call_back command="post.pl"/>
    </merge_daemon>
</mserv_config>
```

Whereas the preceding text is generally directed to merging coverage logs, the following text is generally directed to techniques of merging particular coverage logs.

Figure 5A:
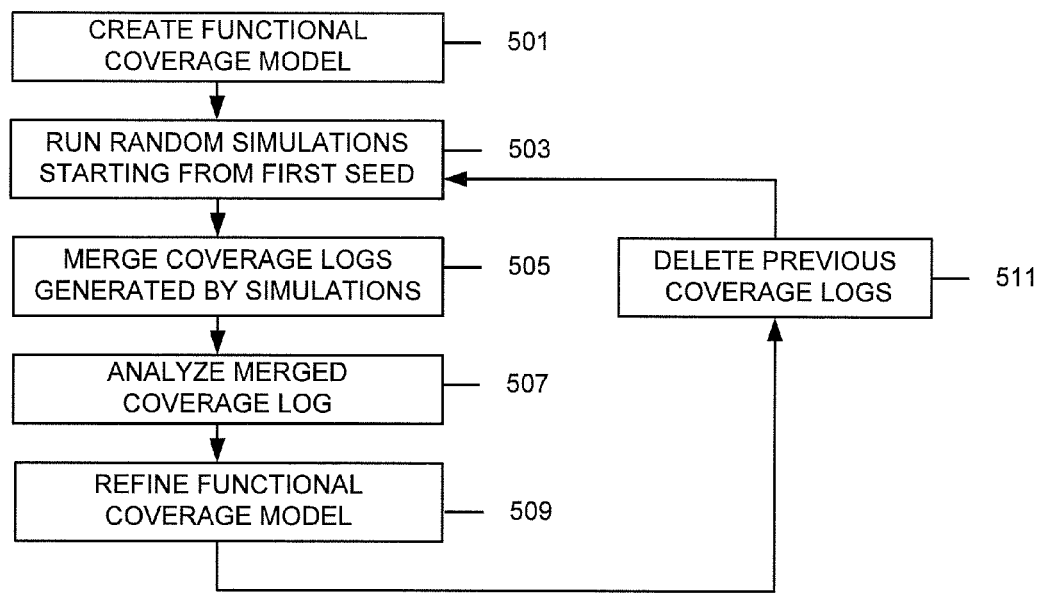
FIGS. 5A and 5B are simplified flow charts contrasting an improved simulation flow that merges, rather than discards, prior coverage logs.
Figure 5B:
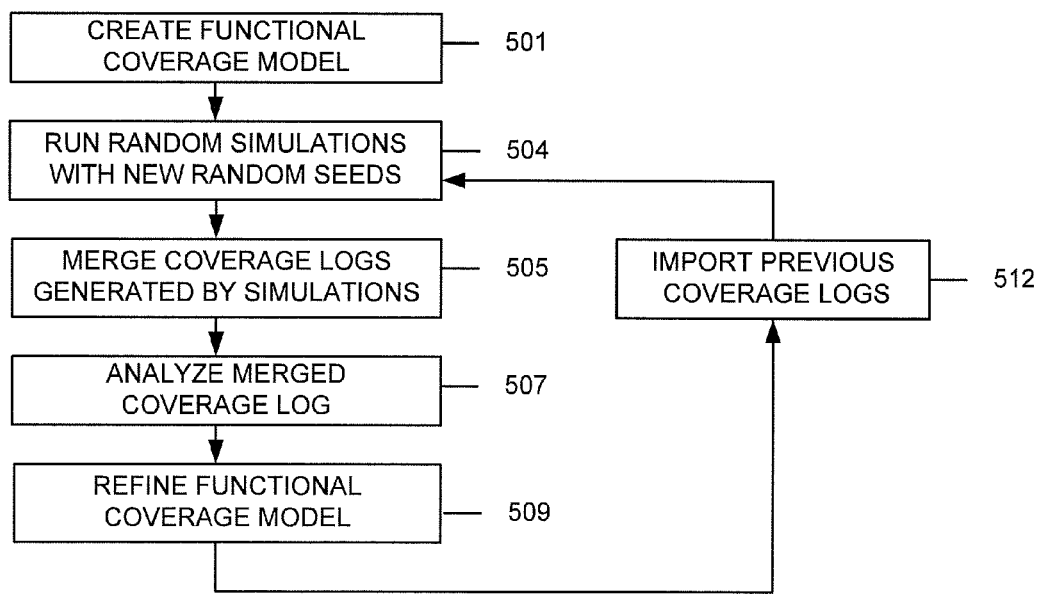

FIGS. 5A and 5B are simplified flow charts contrasting an improved simulation flow that merges, rather than discards, prior coverage logs. Due to the trend of decreasing cost for increased computation resources, each time the simulation model is adjusted, one of ordinary skill in the art would tend to re-run simulations to reach a satisfactory coverage metric (s) result, as shown in FIG. 5A, rather than preserving any coverage data from coverage logs of old simulation models.

The process flow of FIG. 5A is as follows. In 501, a functional coverage model is created. In 503, random simulations are run, starting from some input condition or some first random seed. In 505, coverage logs generated by simulations are merged. In 507, the merged coverage log is analyzed. In 509, the functional coverage model is refined. The process flow repeats, after 611, in which the previous coverage logs are deleted.

The process flow of FIG. 5B modifies the process flow of FIG. 5A. In 504, rather than starting the random simulations from some input condition or some first random seed as in 503, the random simulations are run with new input conditions or new random seeds. In 512, rather than deleting the coverage logs as in 511, the previous coverage logs are imported.

The technology of FIG. 5B can be applied to either the case where coverage logs are merged when all simulations are completed, or prior to completion of the last simulation as discussed above in connection with FIGS. 2-4.

The following examples use SystemVerilog style syntax to represent coverage logs, but are applicable to any hardware verification language with comparable syntax. Log T1 represents an older coverage log. Log T2 represents a newer coverage log. The Merged Log represents the result of merging the respective coverage logs. Each example is followed by explanation.

Example 1:

| Log T1 | Log T2 | Merged Log |
|---|---|---|
| cp1: coverpoint firstsig; option.auto_bin_max = 64; | cp1: coverpoint firstsig; option.auto_bin_max = 32; | cp1: coverpoint firstsig; option.auto_bin_max = 32; |

According to Example 1, differing auto_bin_max values are not merge equivalent.

Example 2:

| Log T1 | Log T2 | Merged Log |
|---|---|---|
| cp2: coverpoint secondsig { bin first = [0:63]; bin mid = [71:82]; } | cp2: coverpoint secondsig { bin first = [0:63]; bin second = [65:128]; } | cp2: coverpoint secondsig { bin first = [0:63]; bin second = [65:128]; } |

According to Example 2, "bin mid=[71:82]" of "coverpoint secondsig" of Log T1 is deleted because it is missing in the definition of "coverpoint secondsig" in Log T2.

Example 3:

| Log T1 | Log T2 | Merged Log |
|---|---|---|
| cp3: coverpoint thirdsig; | cp3: coverpoint thirdsig; | cp3: coverpoint thirdsig; |

According to Example 3, cp3 of log T1 is merge equivalent to cp3 of log T2 and they are merged.

Example 4:

| Log T1 | Log T2 | Merged Log |
|---|---|---|
| Bit[7:0]signal; cp4: coverpoint signal; | Bit[15:0]signal; cp4: coverpoint signal; | cp4: coverpoint signal; |

According to Example 4, "cp4: coverpoint signal" of Log T1 is deleted because the width of the coverpoint expression ('signal') has changed from 8 bits to 16 bits.

Example 5:

| Log T1 | Log T2 | Merged Log |
|---|---|---|
| cc1: cross cp1, cp2; | cc1: cross cp1, cp2; | cc1: cross cp1, cp2; |

According to Example 5, "cc1: cross cp1, cp2;" of Log T1 is deleted due to coverpoint "cp1" of Log T1 being deleted (refer to example 1 for cp1)

Example 6:

| Log T1 | Log T2 | Merged Log |
|---|---|---|
| cc2: cross cp2, cp3 { bins mybin = binsof(cp2) intersect [0:255]; } | cc2: cross cp2, cp3 { bins mybin = binsof(cp2) intersect [0:255]; bins yourbin = binsof(cp2) intersect [256:511]; } | cc2: cross cp2, cp3 { bins mybin = binsof(cp2) intersect [0:255]; bins yourbin = binsof(cp2) intersect [256:511]; } |

According to Example 6, the coverage data for user bins mybin is merged for T1 and T2. The auto crosses of cc2 in T1 which are also in the auto cross coverage space of cc2 in T2 are merged.

Example 7:

| Log T1 | Log T2 | Merged Log |
|---|---|---|
| cc3: cross cp2, cp3 { bins mybin = binsof(cp2) intersect [0:255]; } | cc3: cross cp2, cp3 { bins mybin = binsof(cp2) intersect [0:8191]; } | cc3: cross cp2, cp3 { bins mybin = binsof(cp2) intersect [0:255]; bins mybin = binsof(cp2) intersect [0:8191]; } |

According to Example 7, autocrosses seen in log T1 will still be imported and merged with the ones seen in log T2, despite the fact that autocross coverage space of cc3 is different in T1 and T2 due to differing definitions of the user bin 'mybin'. Some of the autocross bins of cc3 in T1 are subsumed in the definition of user bin mybin in log T2. These autocross bins from log T1 are merged into user bin mybin of log T2. Remaining autocross bins in log T1 will be merged with corresponding autocross bins in log T2.

Example 8:

| Log T1 | Log T2 | Merged Log |
|---|---|---|
|  | cc4: cross cp1, cp2, cp3 | cc4: cross cp1, cp2, cp3 |

According to Example 8, cross point cc4 absent from log T1 but present in T2 is retained after merging.

Example 9:

| Log T1 | Log T2 | Merged Log |
|---|---|---|
| first_prop:cover property(.......); second_prop:cover property(.......); | first_prop:cover property(.......); third_prop:cover property(.......); | first_prop:cover property(.......); second_prop:cover property(.......); third_prop:cover property(.......); |

According to Example 7, cover property 'third_prop' absent from log T1 but present in T2 is retained after merging; and cover property 'second_prop' absent from log T2 but present in T1 is retained after merging.

Figure 6:
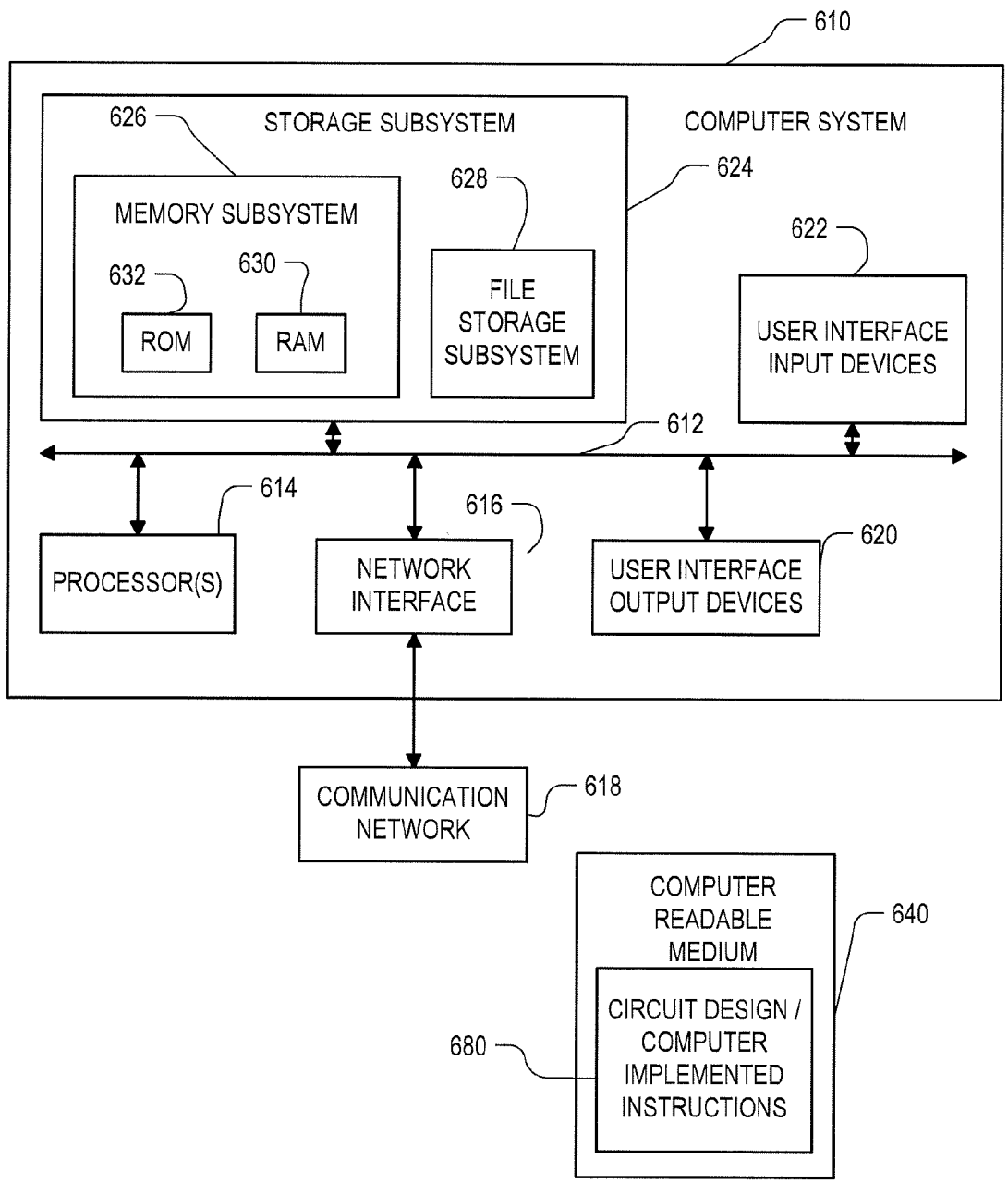
FIG. 6 is a simplified block diagram of a computer system of various embodiments.

FIG. 6 is a simplified block diagram of a computer system of various embodiments.

FIG. 6 is a simplified block diagram of a computer system 610 that can be used to implement software incorporating aspects of the present invention. While the flow charts and other algorithms set forth herein describe series of steps, it will be appreciated that each step of the flow chart or algorithm can be implemented by causing a computer system such as 610 to operate in the specified manner.

Computer system 610 typically includes a processor subsystem 614 which communicates with a number of peripheral devices via bus subsystem 612. Processor subsystem 614 may contain one or a number of processors. The processor subsystem 614 provides a path for the computer system 610 to receive and send information described herein, including within the processor subsystem 614, such as with a multi-core, multiprocessor, and/or virtual machine implementation. The peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610. Network interface subsystem 616 provides an interface to outside networks, including an interface to communication network 618, and is coupled via communication network 618 to corresponding interface devices in other computer systems. Communication network 618 may comprise many interconnected computer systems and communication links. These communication links may be wireline links, optical links, wireless links, or any other mechanisms for communication of information. While in one embodiment, communication network 618 is the Internet, in other embodiments, communication network 618 may be any suitable computer network. The communication network 618 provides a path for the computer system 610 to receive and send information described herein.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 622 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 610 or onto computer network 618.

User interface output devices 620 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 610 to the user or to another machine or computer system.

Storage subsystem 624 stores the basic programming and data constructs that provide the functionality of certain embodiments of the present invention. For example, the various modules implementing the functionality of certain embodiments of the invention may be stored in storage subsystem 624. These software modules are generally executed by processor subsystem 614.

Memory subsystem 626 typically includes a number of memories including a main random access memory (RAM) 630 for storage of instructions and data during program execution and a read only memory (ROM) 632 in which fixed instructions are stored. File storage subsystem 628 provides persistent storage for program and data files, and may include a hard disk drive, a floppy disk drive along with associated removable media (illustratively shown as computer readable medium 640 storing circuit design 680), a CD/DVD ROM drive, an optical drive, or removable media cartridges. The databases and modules implementing the functionality of certain embodiments of the invention may have been provided on a computer readable medium such as one or more CD/DVD-ROMs, and may be stored by file storage subsystem 628. The host memory 626 contains, among other things, computer instructions which, when executed by the processor subsystem 614, cause the computer system to operate or perform functions as described herein. As used herein, processes and software that are said to run in or on "the host" or "the computer", execute on the processor subsystem 614 in response to computer instructions and data in the host memory subsystem 626 including any other local or remote storage for such instructions and data.

Bus subsystem 612 provides a mechanism for letting the various components and subsystems of computer system 610 communicate with each other as intended. Although bus subsystem 612 is shown schematically as a single bus, alternative embodiments of the bus subsystem may use multiple busses.

Computer system 610 itself can be of varying types including a personal computer, a portable computer, a workstation, a computer terminal, a network computer, a television, a mainframe, a parallel processing system, a network of more than one computer, or any other data processing system or user device. Due to the ever changing nature of computers and networks, the description of computer system 610 depicted in FIG. 6 is intended only as a specific example for purposes of illustrating the preferred embodiments of the present invention. Many other configurations of computer system 610 are possible having more or less components than the computer system depicted in FIG. 6.

The following is a mathematical appendix discussing exemplary conditions of merging coverage logs.

1. Merge Equivalence

Coverable objects across logs are merged if they are merge equivalent. The notion of merge equivalence is different for coverpoints and crosspoints. We use the notation $A1 \equiv_{merge-eq} A2$ to indicate that A1 and A2 are merge equivalent.

1.1 Merge Equivalence of Coverpoints
1.1.1 Merge Equivalence of Autobinned Coverpoints
1.1.1.1. Default Merge Equivalence
$P1 \equiv_{merge-eq} P2$ iff
name(P1)≡name(P2)
auto_bin_max(P1)=auto_bin_max(P2)
width(P1)=width(P2)
where P1 and P2 are auto-binned coverpoints.
1.1.1.2 Flexible Merge Equivalence
This is same as default merge equivalence for autobinned coverpoints.
1.1.2 Merge Equivalence of Userbinned Coverpoints
1.1.2.1 Default Merge Equivalence
$P1 \equiv_{merge-eq} P2$ iff
name(P1)≡name(P2)
width(P1)=width(P2)
$B_u(P1)=B_u(P2)$
where P1 and P2 are user-binned coverpoints and $B_u(P)$ indicates the set of user defined bins.
1.1.2.2 Flexible Merge Equivalence
$P1 \equiv_{merge-eq} P2$ iff
name(P1)≡name(P2)
width(P1)=width(P2)
Note that the requirement to have same set of user-defined bins is dropped.
1.2 Merge Equivalence of Crosspoints
Consider a crosspoint,
C=P1×P2 . . . . ×Pn
We define the following:
$B_u$=Set of user defined bins in cross C
For bin b∈$B_u$, we define the following:
$S_b$=Auto cross bins comprising the user defined bin b
$B_a$=Set of auto cross bins=$\pi\Pi B_j - S_{Bu}$
$B_{ign}$=Set of illegal/ignore/unreachable auto cross bins
Π=Set cross product operator
$B_j$=Set of bins in jth coverpoint, $P_j$.
The notation $B_u$ (C) is used to indicate the set of user defined bins for cross C.
Similar notation is extended for other sets like $B_a$ etc.
Consider two cross points:
C1=A1×A2 . . . ×An, where A1, A2, . . . , An are component coverpoints.
C2=B1×B2 . . . ×Bm, where B1, B2, . . . , Am are component coverpoints
1.2.1 Default Merge Equivalence
$C1 \equiv_{merge-eq} C2$ if the following holds.
Both crosses have the same number of coverpoints.
n==m
Component coverpoints are pair wise merge equivalent.
$A1 \equiv_{merge-eq} B1, A2 \equiv_{merge-eq} B2 \ldots, An \equiv_{merge-eq} Bm$
$B_u(C1)=B_u(C2)$
If D is the set of user defined bins in C1 and C2, then the following holds $\forall d \in D \; S_d(C(T1))=S_d(C(T2))$
1.2.2 Flexible Merge Equivalence
$C1 \equiv_{merge-eq} C2$ if the following holds.

Both crosses have the same number of coverpoints.

n==m

Component coverpoints are pair wise merge equivalent.

A1≡$_{merge-eq}$ B1, A2≡$_{merge-eq}$ B2 ..., An≡$_{merge-eq}$ Bm

The above rules have the following implication:

If a coverpoint cannot be merged, any crosspoint involving that coverpoint will simply be added to the merged log. In short≠$_{merge-eq}$ of coverpoints has a ripple effect to all the crosspoints.

1.2 Merge Equivalence of Assertions 1.2.1 Default Merge Equivalence

For assertions A1 and A2, A1≡$_{merge-eq}$ A2 if the following holds.

name(A1)=name(A2)

1.2.2 Flexible Merge Equivalence

These rules are same as default merge equivalence.

2. Rules for Merging

The rules for default merging are straightforward since default merge equivalence ensures that the coverage space is the same across logs being merged.

The following sections describe the rules for flexible merging.

2.1 Rules for Merging Coverpoints and Crosspoints

Let M(T1) be a coverpoint/crosspoint in T1 and M(T2) be a coverpoint/crosspoint in T2.

1. If M(T1)≡$_{merge-eq}$ M(T2), after merging according to the rules defined above, bins defined only in the older functional coverage model will be dropped.

2. If M(T1)≠$_{merge-eq}$ M(T2) then the merged log contains M(T2), where T2 is the log with a more recent functional coverage model.

2.2 Rules for Merging Assertions

If A(T1) is an assertion in log T1 and A(T2) is an assertion in log T2, then they are merged according to the following rules.

1. If A(T1)≡$_{merge-eq}$ A(T2) then the merged log contains A(T1)(or A(T2)).

2. If A(T1)≠$_{merge-eq}$ A(T2) then the merged log contains A(T2), where T2 is the more recent log.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An electronic design automation method, comprising:
using a computer, merging a first coverage log of a first simulation of a hardware description language circuit design with a second coverage log of a second simulation of the hardware description language circuit design, the first simulation being based on a first hardware verification language coverage model of the hardware description language circuit design, the second simulation being based on a second hardware verification language coverage model of the hardware description language circuit design, the second hardware verification language coverage model being newer and different than the first hardware verification language coverage model.

2. The electronic design automation method of claim 1, wherein a hardware description language of the hardware description language circuit design includes any of Verilog, SystemVerilog, and VHDL.

3. The electronic design automation method of claim 1, wherein a hardware verification language of the first and second hardware verification language models includes any of SystemVerilog, Native Testbench, E, and Vera.

4. The electronic design automation method of claim 1, wherein said merging includes:
responsive to the first coverage log and the second coverage log including different maximum numbers of automatically created bins, retaining coverage data of the cover point of the second coverage log and deleting coverage data of the cover point from the first coverage log.

5. The electronic design automation method of claim 1, wherein said merging includes:
responsive to the first coverage log including a bin having a bin name absent from the second coverage log, deleting coverage data of the bin after said merging.

6. The electronic design automation method of claim 1, wherein said merging includes:
responsive to the first coverage log including a bin having a bin name present in the second coverage log, retaining coverage data of the bin after said merging.

7. The electronic design automation method of claim 1, wherein said merging includes:
responsive to the first coverage log having a cover point with a first expression width and the second coverage log having the cover point with a second expression width different from the first expression width, retaining coverage data of the cover point with the second expression width and deleting coverage data of the cover point with first expression width.

8. The electronic design automation method of claim 1, wherein said merging includes:
responsive to the first coverage log having a bin with a first bin definition and the second coverage log has the bin with a second bin definition different from the first bin definition, then after said merging, retaining coverage data of the bin with the second bin definition and deleting coverage data of the first bin definition.

9. The electronic design automation method of claim 1, wherein said merging includes:
responsive to the first coverage log including a cross coverage point name of a cross coverage point naming at least two coverage point identifiers, and the second coverage log includes the cross coverage point name of the cross coverage point naming said at least two coverage point identifiers, then deleting coverage data of the cross coverage point of the first coverage log responsive to deletion of coverage data of at least one of the identified coverage points from the first coverage log.

10. The electronic design automation method of claim 1, wherein said merging includes:
responsive to the first coverage log including a first user-defined cross bin of a first cross coverage point, and the second coverage log including a second user-defined cross bin of a second cross coverage point, the first cross coverage point and the second cross coverage point having a same name, then despite the first user-defined cross bin and the second user-defined cross bin having different definitions, retaining coverage data of the first user-defined cross bin and coverage data of the second user-defined cross bin.

11. The electronic design automation method of claim 1, wherein said merging includes:
responsive to the first coverage log including first autocross bins of a first cross coverage point, and the second coverage log including a second user-defined cross bin subsuming the autocross bins of the first cross coverage point, retaining coverage data of the first autocross bins in the second user-defined cross bin of the second coverage log.

12. The electronic design automation method of claim 1, wherein said merging includes:
responsive to the first coverage log including a first cross coverage point, and the second coverage log including a second cross coverage point, then despite the first cross coverage point and the second cross coverage point having different auto cross coverage space, retaining i) auto cross coverage data of the first cross coverage point that is subsumed by auto cross coverage space of the second cross coverage point, and ii) coverage data of the second cross coverage point.

13. The electronic design automation method of claim 1, wherein said merging includes:
responsive to the second coverage log including a cross coverage point absent from the first coverage log, retaining the cross coverage point.

14. The electronic design automation method of claim 1, wherein said merging includes:
responsive to the first coverage log including a cross coverage point absent from the second coverage log, deleting the cross coverage point.

15. The electronic design automation method of claim 1, wherein said merging includes:
responsive to the first coverage log including property coverage absent from the second coverage log, retaining the property coverage.

16. The electronic design automation method of claim 1, wherein said merging includes:
responsive to the second coverage log including property coverage absent from the first coverage log, retaining the property coverage.

17. A non-transitory computer readable medium with computer readable instructions, which when executed by a computer perform an electronic design automation method for circuit design, comprising:
computer instructions merging a first coverage log of a first simulation of a hardware description language circuit design with a second coverage log of a second simulation of the hardware description language circuit design, the first simulation being based on a first hardware verification language coverage model of the hardware description language circuit design, the second simulation being based on a second hardware verification language coverage model of the hardware description language circuit design, the second hardware verification language coverage model being newer and different than the first hardware verification language coverage model.

18. An apparatus, comprising:
a computer with a memory storing computer instructions merging a first coverage log of a first simulation of a hardware description language circuit design with a second coverage log of a second simulation of the hardware description language circuit design, the first simulation being based on a first hardware verification language coverage model of the hardware description language circuit design, the second simulation being based on a second hardware verification language coverage model of the hardware description language circuit design, the second hardware verification language coverage model being newer and different than the first hardware verification language coverage model.

* * * * *